United States Patent
Jung

(10) Patent No.: US 10,999,546 B2
(45) Date of Patent: May 4, 2021

(54) IMAGE SENSOR AND METHOD OF OPERATING SAME

(71) Applicant: SAMSUNG ELECTRONICS CO., LTD., Suwon-si (KR)

(72) Inventor: Seung Hoon Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/672,692

(22) Filed: Nov. 4, 2019

(65) Prior Publication Data

US 2020/0288079 A1 Sep. 10, 2020

(30) Foreign Application Priority Data

Mar. 6, 2019 (KR) .................. 10-2019-0025504

(51) Int. Cl.
| | |
|---|---|
| *H04N 5/374* | (2011.01) |
| *H04N 5/3745* | (2011.01) |
| *H04N 5/378* | (2011.01) |
| *H01L 27/146* | (2006.01) |

(52) U.S. Cl.
CPC ..... *H04N 5/3745* (2013.01); *H01L 27/14643* (2013.01); *H04N 5/378* (2013.01)

(58) Field of Classification Search
None
See application file for complete search history.

(56) References Cited

U.S. PATENT DOCUMENTS

| | | | | |
|---|---|---|---|---|
| 6,707,493 | B1* | 3/2004 | Lee .................. | H04N 5/367 348/246 |
| 8,482,447 | B2* | 7/2013 | Hwang .............. | H03M 1/14 341/169 |
| 8,933,385 | B2 | 1/2015 | Wang et al. | |
| 9,253,423 | B2 | 2/2016 | Shida et al. | |
| 9,357,147 | B2 | 5/2016 | Nishida et al. | |
| 9,490,833 | B2 | 11/2016 | Lee et al. | |
| 9,515,120 | B2* | 12/2016 | Um .................. | H01L 27/14609 |
| 9,571,777 | B2 | 2/2017 | Kusano | |
| 9,679,935 | B2* | 6/2017 | Um .................. | H01L 27/14643 |
| 9,712,772 | B2 | 7/2017 | Kim et al. | |
| 9,900,013 | B2 | 2/2018 | Hwang | |
| 2009/0066826 | A1* | 3/2009 | Gelfand ............ | H04N 5/378 348/308 |
| 2013/0182157 | A1* | 7/2013 | Ono ................. | H04N 5/3575 348/294 |
| 2014/0232890 | A1* | 8/2014 | Yoo ................. | H04N 5/378 348/220.1 |

(Continued)

*Primary Examiner* — James M Hannett
(74) *Attorney, Agent, or Firm* — Volentine, Whitt & Francos, PLLC

(57) ABSTRACT

An image sensor includes; a sensor array generating a pixel signal, a ramp signal generator generating a ramp signal having a decreasing slope during a ramp signal enable period between a first time at which a counter enable signal is activated and a third time at which the ramp signal ends falling, a comparator comparing the pixel signal with the ramp signal to trigger an output signal, and counters, where at least one of the counters performs counting during an entire counter enable period extending between the first time and a second time at which the comparator triggers the output signal, but not all of the counters perform counting during at least one section of the counter enable period.

20 Claims, 16 Drawing Sheets

(56) References Cited

U.S. PATENT DOCUMENTS

| | | | |
|---|---|---|---|
| 2015/0124137 A1* | 5/2015 | Sato | H03M 1/1245 |
| | | | 348/308 |
| 2015/0263710 A1* | 9/2015 | Kim | H04N 5/378 |
| | | | 327/126 |
| 2018/0041218 A1* | 2/2018 | Sato | H03M 1/56 |
| 2018/0084213 A1 | 3/2018 | Kim | |

* cited by examiner

IMAGE SENSOR AND METHOD OF OPERATING SAME

CROSS-REFERENCE TO RELATED APPLICATION

This application claims priority under 35 U.S.C. 119 to Korean Patent Application No. 10-2019-0025504 filed on Mar. 6, 2019, the subject matter of which is hereby incorporated by reference.

BACKGROUND

The inventive concept relates generally to image sensors and methods of operating same. More particularly, the inventive concept relates to image sensors including a mask counter among a plurality of counters.

An image sensor converts incident electromagnetic energy (e.g., light) into a corresponding electrical signal. Recently, with the development of a computer industry and a communication industry, demand for image sensors with improved performance has increased across a variety of fields, such as digital cameras, camcorders, personal communication systems (PCS), game consoles, security devices, medical devices, etc.

Image sensors include charge coupled device (CCD) devices and a complementary metal oxide semiconductor (CMOS) devices. However, CMOS image sensors are characterized by simple driving techniques and densely integrated (e.g., single chip) signal processing circuits which make CMOS image sensors advantageous in the miniaturization of contemporary consumer products.

Image sensors are often used in mobile devices, such as mobile phones. Since mobile devices operate on battery power, power consumption is always an important design consideration, but consumers continue to demand high resolution devices. Accordingly, image sensors are required that provide high image resolution and low power consumption.

SUMMARY

Embodiments of the inventive concept provide image sensors and methods of operating same that provide high image resolution and low power consumption.

According to one aspect of the inventive concept, an image sensor includes; a sensor array which generates a pixel signal, a ramp signal generator which generates a ramp signal in response to a ramp enable signal, wherein the ramp signal has a decreasing slope during a ramp signal enable period extending between a first time at which a counter enable signal is activated and a third time at which the ramp signal ends falling, a comparator which compares the pixel signal with the ramp signal to trigger an output signal, and a counter unit including a plurality of counters, wherein at least one of the plurality of counters performs counting during a counter enable period extending between the first time and a second time at which the comparator triggers the output signal. The counter enable period may be divided into a first section and a second section, the plurality of counters may include a mask counter and remaining counters among the plurality of counters except the mask counter, where not all of the plurality of counters perform counting during at least one of the first section and the second section.

According to another aspect of the inventive concept, a method of operating an image sensor includes; generating a pixel signal in a sensor array, generating a ramp signal in response to a ramp enable signal, wherein the ramp signal has a decreasing slope during a ramp signal enable period extending between a first time at which a counter enable signal is activated and a third time at which the ramp signal ends falling, comparing the pixel signal with the ramp signal to trigger an output signal, and using at least one of a plurality of counters to perform counting during a counter enable period extending between the first time and a second time at which the comparator triggers the output signal. The counter enable period may be divided into a first section and a second section following the first section. The plurality of counters may include a mask counter and remaining counters among the plurality of counters except the mask counter, and not all of the plurality of counters perform counting during at least one of the first section and the second section.

According to another aspect of the inventive concept, an image system includes; an image sensor which converts incident light into a corresponding digital signal, and a memory device which stores the digital signal. The image sensor may include; a sensor array which generates a pixel signal, a ramp signal generator which generates a ramp signal in response to a ramp enable signal, wherein the ramp signal has a decreasing slope during a ramp signal enable period extending between a first time at which a counter enable signal is activated and a third time at which the ramp signal ends falling, a comparator which compares the pixel signal with the ramp signal to trigger an output signal when the ramp signal equals the pixel signal, and a counter unit including a plurality of counters, wherein at least one of the plurality of counters performs counting during a counter enable period extending between the first time and a second time at which the comparator triggers the output signal. The counter enable period may be divided into a plurality of sections, the plurality of counters may include a mask counter and remaining counters among the plurality of counters except the mask counter, and the mask counter may perform a mask counting only during one of the plurality of first sections, and the remaining counters may perform counting during other ones of the plurality of sections.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Certain advantages and features associated with the inventive concept may be better understood upon consideration of the following detailed description of embodiments together with the accompanying drawings. The inventive concept on may, however, be variously embodied and should not be construed as being limited to only the illustrated embodiments set forth herein. Rather, these embodiments are provided so that this disclosure will be thorough and complete and will fully convey the inventive concept to those skilled in the art.

Figure 1:
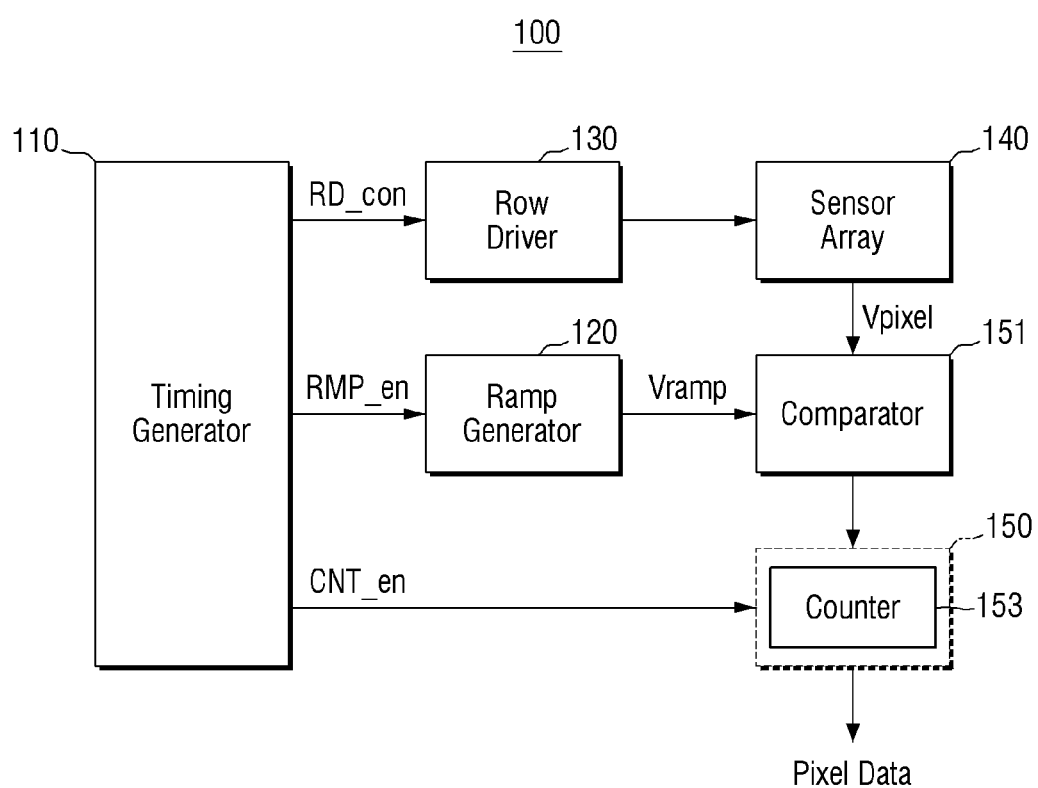
FIG. 1 is a block diagram illustrating an image sensor according to embodiments of the inventive concept.

FIG. 1 is a block diagram illustrating an image sensor 100 according to embodiments of the inventive concept.

Referring to FIG. 1, the image sensor 100 generally comprises a timing signal generator 110, a ramp signal generator 120, a row driver 130, a sensor array 140, a comparator 151, and a counter unit 150, wherein the counter unit 150 may include a plurality of counters 153.

The timing signal generator 110 may be used to selectively and respectively generate at least a row driver control signal RD_con, a ramp enable signal RMP_en, and a counter enable signal CNT_en.

The ramp signal generator 120 may be used to generate a ramp signal Vramp in response to the ramp enable signal RMP_en. The ramp signal Vramp is a voltage signal that varies over a defined time period. For example, the ramp signal may have a slope that constantly decreases over a period of time referred to as a "ramp signal enable period." The ramp signal Vramp is communicated to the comparator 151 and may be used to convert analog signal(s) received from the sensor array 140 into corresponding digital signal(s) applied to the counter 150.

The row driver 130 may be used to sequentially drive a plurality of rows in the sensor array 140 in response to the row driver control signal RD_con. Thus, the row driver 130 may be electrically connected to the plurality of rows of the sensor array 140, such that pixels of the sequentially selected rows in the row driver 130 may switch detected (or incident) light into corresponding electrical pixel signal(s) Vpixel.

In this regard, the sensor array 140 includes a plurality of pixels, commonly arranged in a matrix of rows and columns. For example, the plurality of pixels may be located at the respective intersections of the rows and columns, but the scope of the inventive concept is not limited to only sensor arrays having this type of configuration. Each pixel in the plurality of pixels may be a photo diode, a photo transistor, a photo gate, a pinned photo diode or some combination thereof. For example, the respective pixels may have a 4-transistor structure including a photodiode, a transmission transistor, a reset transistor, an amplification transistor, and a selection transistor. Alternately or additionally, the pixels may have a 1-transistor structure, a 3-transistor structure, a 5-transistor structure, or another structure in which a plurality of pixels shares some transistors. Regardless of specific pixel structure, the sensor array 140 may be used to convert detected (or incident) light into a corresponding, analog pixel signal Vpixel and then communicate the pixel signal Vpixel to the comparator 151.

Thus, in its operation the comparator 151 may (1) receive the analog pixel signal Vpixel and the ramp signal Vramp, (2) compare the ramp signal Vramp with the pixel signal Vpixel, (3) generate (or trigger) an output signal in response to the comparison of the ramp signal Vramp with the pixel signal Vpixel, and (4) provide the triggered output signal to the counter unit 150. In certain embodiments of the inventive concept, the comparator 151 may perform a correlated double sampling (CDS) operation to reduce overall noise in the output signal. Therefore, the image sensor 100 may further include a CDS circuit that extracts a noise-reduced signal from a difference between the ramp signal Vramp and the pixel signal Vpixel.

The counter unit 150 may be used to generate a counting signal in response to the output signal provided by the comparator 151 (e.g., in response to a difference between the ramp signal Vramp and the counter enable signal CNT_en). For example, at least one counter in the counter unit 150 may start a counting operation to generates the counting signal when generation of the ramp signal Vramp is started by the ramp generator 120, and may stop (or end) the counting operation when the output signal is triggered by the comparator 151. As will be appreciated by those skilled in the art, the output signal provided by the comparator 151 may be variously triggered. Hence, the timing signal generator 110 may activate the counter enable signal CNT_en at a selected time in relation to an activation of the ramp enable signal RMP_en, taking into account an anticipated delay in the generation of the ramp signal Vramp. Thus, the counter enable signal CNT_en may be activated before, after or synchronously with the activation of the ramp enable signal RMP_en. Hereinafter, it will be assumed that the ramp enable signal RMP_en and the counter enable signal CNT_en are synchronously activated (i.e., started at the same time). In this manner the counter unit 150 may "count" in response to the output signal provided by the comparator 151, and together with the comparator 151 the counter unit 150 may generate pixel data Pixel Data according to a resulting count number.

Figure 2:
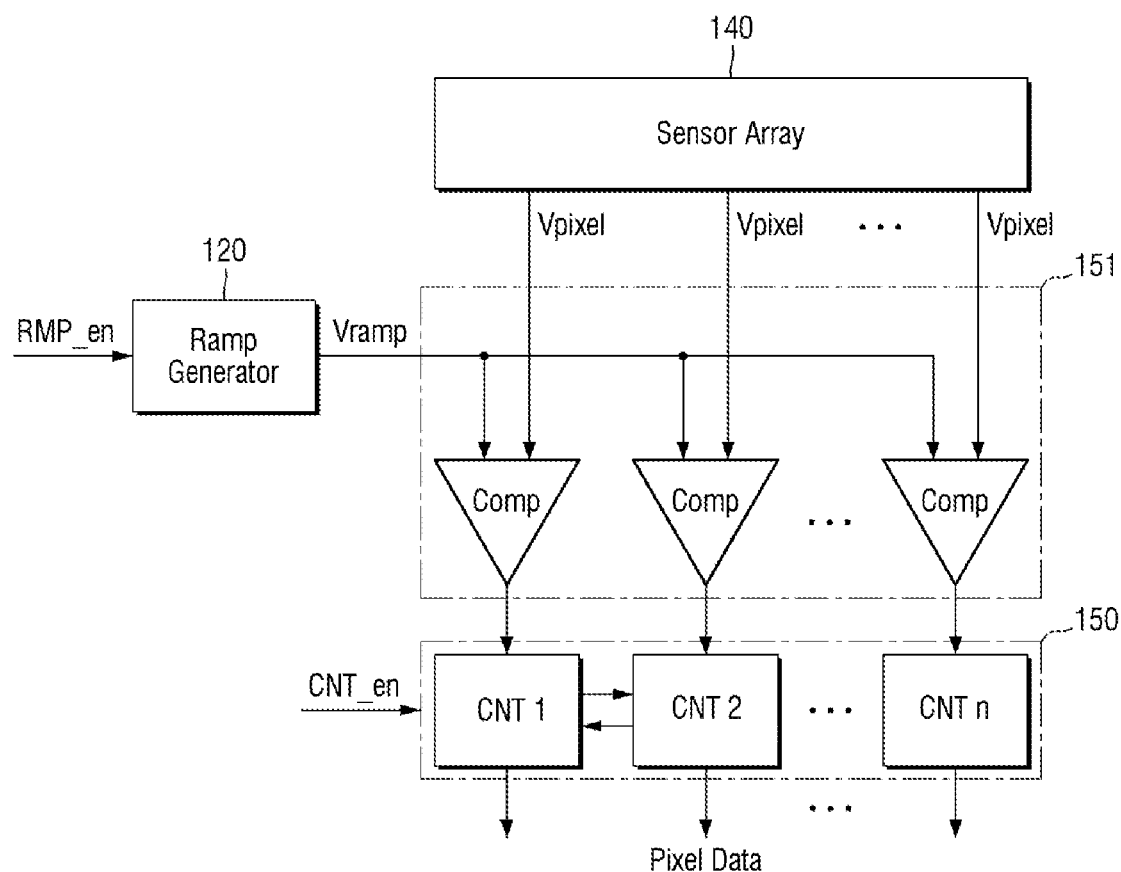
FIG. 2 is a block diagram further illustrating in one example the image sensor of FIG. 1.

FIG. 2 is a block diagram further illustrating in one example certain features of the image sensor 100 of FIG. 1 according to embodiments of the inventive concept.

Referring to FIG. 2, the comparator 151 may include a plurality of comparators Comp respectively connected to at least one column of the sensor array 140. The plurality of comparators Comp may be used to generate comparison values between the ramp signal Vramp and the pixel signal Vpixel which are then communicated to the counter unit 150. The counter unit 150 may include a plurality of counters (e.g., CNT 1 to CNT n) respectively connected to at least one of the plurality of comparators Comp. The plurality of counters (CNT 1 to CNT n) may exchange counting information with one another. For example, a single comparator Comp and a single counter CNT (e.g., a first counter CNT 1) may be connected in series with each column of the sensor array 140. The ramp signal Vramp generated by the ramp signal generator 120 in response to the ramp enable signal RMP_en may be provided to the respective comparators 151.

Each pixel of the sensor array 140 may be used to convert incident light across a defined band of electromagnetic wavelengths into a corresponding electrical signal and output the electrical signal as pixel signal Vpixel. Each comparator Comp may compare the ramp signal Vramp with the pixel signal Vpixel and may then trigger an output signal at a point in time where the respective amplitudes of the ramp signal Vramp and the pixel signal Vpixel become equal. Each of the plurality of counters (CNT 1 to CNT n) may start counting at a point in time at which the counter enable signal CNT_en is activated in response to the counter enable signal CNT_en. Each of the plurality of counters (CNT 1 to CNT n) may count up (or count down), thereby generating a counting number, to a point in time at which the ramp signal Vramp and the pixel signal Vpixel become equal. Thus, each of the plurality of counters (CNT 1 to CNT n) may output the pixel data Pixel Data corresponding to a respectively generated counting number.

It should be noted here that as the number of counting operations performed by each of the plurality of counters (CNT 1 to CNT n) increases, the overall power consumed by the image sensor also increases. In view of this outcome, a variety of counting operation(s) that may be performed by the plurality of counters (CNT 1 to CNT n). Selected example of such counting operation(s) will be described in some additional detail with reference to FIGS. 2 and 3.

Figure 3:
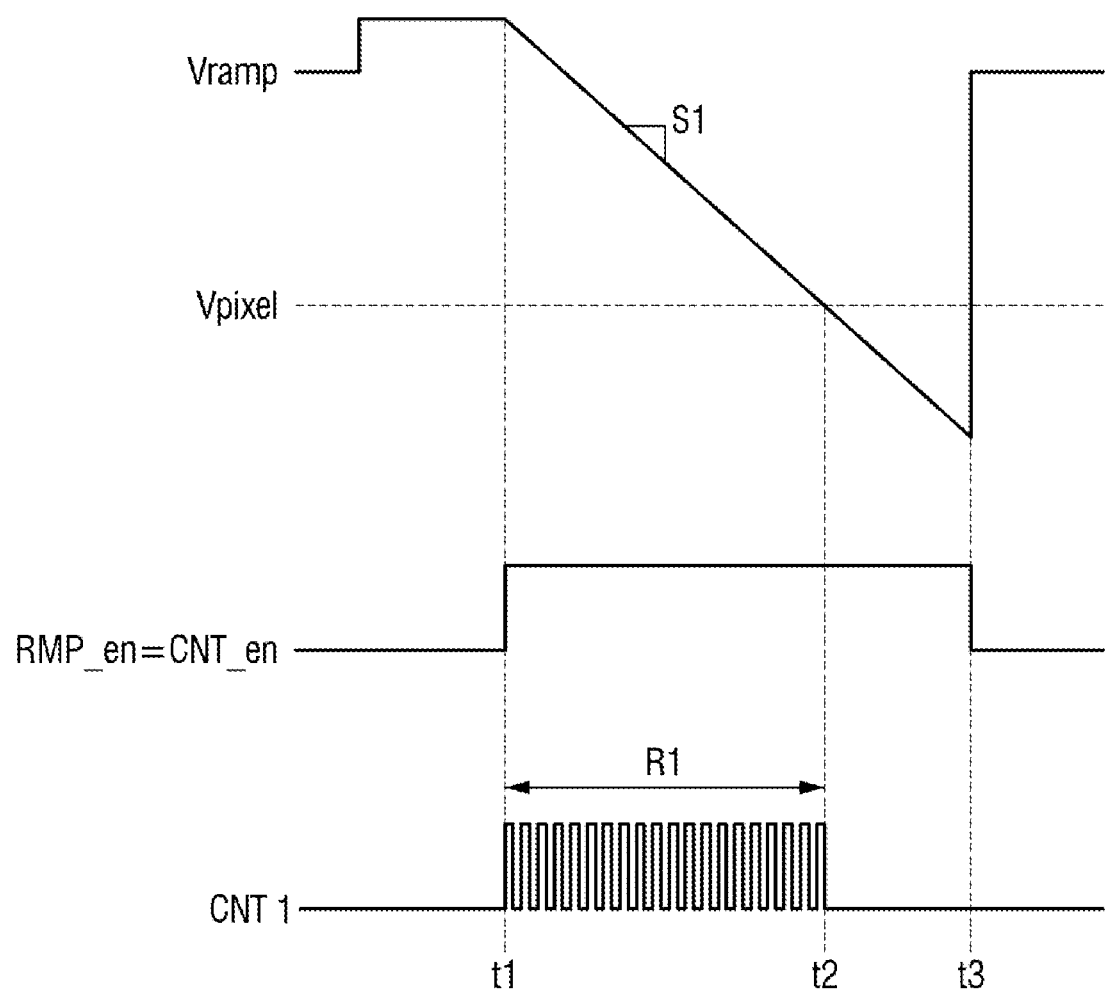
FIGS. 3, 4, 5, 6, 7, 8 and 9 are respective waveform diagrams variously illustrating certain signal relationships associated with the counting performed by the image sensor of FIGS. 1 and 2.

FIG. 3 is a timing diagram illustrating certain signal relationships associated with the foregoing counting operation.

Referring collectively to FIGS. 2 and 3, the comparator 151 receives the ramp signal Vramp provided by the ramp signal generator 120 and the pixel signal Vpixel provided by the sensor array 140. The ramp signal Vramp starts falling at a first slope S1 at a first time t1 and finishes falling at a third time t3.

In the illustrated example of FIG. 3, it is assumed that the ramp enable signal RMP_en and the counter enable signal CNT_en are simultaneously generated at a logically high level (hereafter, "high") (e.g., at the first time t1). The comparator 151 compares the ramp signal Vramp with the pixel signal Vpixel, triggers the output signal at a point in time where the ramp signal Vramp and the pixel signal Vpixel become equal, and communicates the output signal to the plurality of counters (CNT 1 to CNT n). The plurality of counters (CNT 1 to CNT n) start counting when the counter enable signal CNT_en is activated. For example, the first counter CNT 1 may start counting at the first time t1 when the counter enable signal CNT_en is activated.

With the foregoing assumptions in mind, the comparator 151 triggers the output signal at the second time t2—the point in time at which the amplitudes of the pixel signal Vpixel and the ramp signal Vramp are equal. In response to the triggering of the output signal at the second time t2, the plurality of counters (CNT 1 to CNT n) stop counting and generate the pixel data using the resulting counting number.

Assuming a particular configuration wherein a number of the plurality of counters (CNT 1 to CNT n) in the counter unit 150 is equal to a number of columns in the sensor array 140, and further assuming that each one of the plurality of counters (CNT 1 to CNT n) performs "m" countings, the image sensor 100 of FIG. 1 would consume sufficient power to perform m time n counting operations. This outcome may prove increasingly troublesome as demands for ever higher image resolution continue to drive the number of image sensor columns and/or counters upward.

Accordingly, certain embodiments of the inventive concept provide a mask counting operation that may be performed independent of other counting operations performed by an image sensor to thereby reduce the power consumption. In this regard, an overall counting operation may include one or more "mask counting" operation(s) and a plurality of (regular) counting operations. Here, the mask counting operation may be performed by one or more counters designated as a "mask counter", while the counting operations are performed by counters similar in configuration and operation (e.g.,) to the plurality of counters (CNT 1 to CNT n) previously described. For example, one counter (e.g., the first counter CNT 1) from among the plurality of counters (CNT 1 to CNT n) may be designated as the mask counter, while the remaining counters (CNT 2 to CNT n) among the plurality of counters (CNT 1 to CNT n), excepting the mask counter, may be designated as respective counters. Alternately, multiple counters among the plurality of counters (CNT 1 to CNT n) may be designated as mask counters, while and the remaining counters in the plurality of counters (CNT 1 to CNT n), excepting the mask counters, may be designated as respective counters.

For example, assuming a plurality of counters (CNT1 to CNT n) including one (1) mask counter (e.g., the first counter CNT 1) and (n−1) counters (e.g., CNT 2 to CNT n), the mask counter may perform "m" counting operations. In contrast, the (n−1) counters may perform (m-k) operations, where "k" in a positive integer less than "m". Here, only m counting are performed by a single counter (e.g., the master counter, or the first counter CNT 1) among the plurality of counters (CNT 1 to CNT n), while (m−k) countings are performed by the remaining (n−1) counters (e.g., the second counter CNT 2 to the n-th counter CNT n). As a result, the total number of counting operations performed by the image sensor 100 may be notably reduced. As a result, and the power consumed by the image sensor may be reduced.

Hereinafter, certain methods of operation for an image sensor including at least one mask counter operation according to embodiments of the inventive concept will be described with reference to FIGS. 4 through 9, inclusive. Thus, FIGS. 4 through 9 are respective waveform diagrams illustrating in various examples, certain methods of operation for an image sensor according to embodiments of the inventive.

Figure 4:
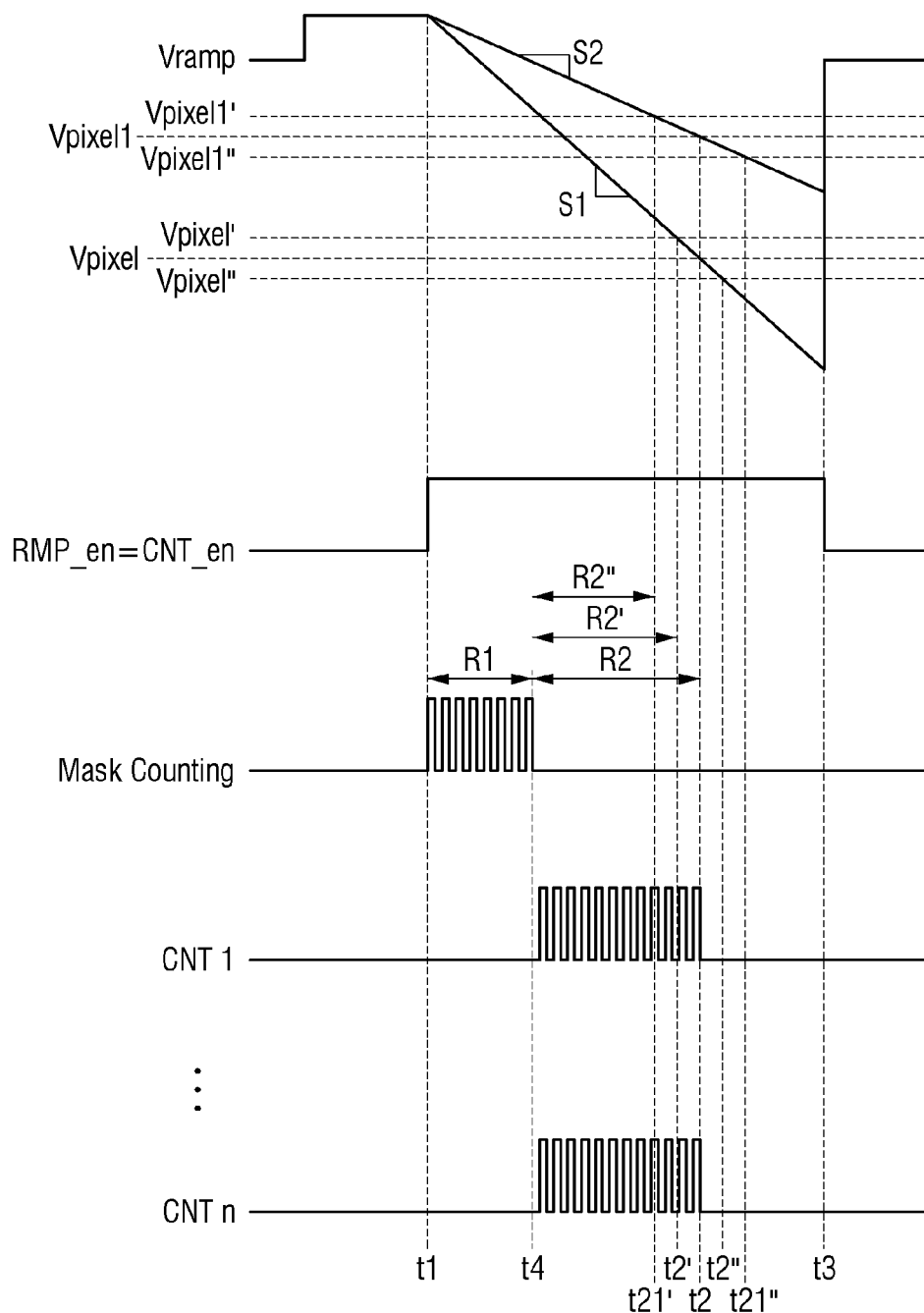

Referring to FIGS. 2 and 4, the ramp enable signal RMP_en and the counter enable signal CNT_en are assumed to simultaneously transition (e.g., rise) at the first time t1 and transition back (e.g., fall) at the third time t3. The ramp signal Vramp is further assumed to fall constantly over a time period between the first time t1 and the third time t3 at a first slope S1. The pixel signal Vpixel is generated as described above.

The comparator 151 triggers the output signal at the second time t2 at which the pixel signal Vpixel and the ramp signal Vramp have equal levels (e.g., amplitudes). Thus, the plurality of counters (CNT 1 to CNT n), as a group, starts counting at the first time t1 when the counter enable signal CNT_en is activated and ends counting at the triggered output signal at the second time t2. However, unlike the embodiments wherein all of the counters among the plurality of counters perform counting operations over the entire period between the first time t1 and the second time t2, certain embodiments of the invention concept include a plurality of counters that are capable of being selectively enabled (i.e., begin counting) and/or selectively disabled (i.e., end counting) during the time period between the first time t1 and the second time t2.

For example, in the method embodiment illustrated in FIG. 4, only a mask counter (e.g., CNT 1) of the plurality of counters (CNT 1 to CNT n) begin a counting operation (i.e., a mask counting) at the first time t1. That is, the mask counter (CNT1) is enabled at the first time t1, but may be disabled well before the second time period t2. In this regard, the period of time between the first time t1 and the second time t2 may be divided into a first section R1 and a second section R2 at a fourth time t4, where the mask counter (e.g., CNT1) performs the mask counting during the first section R1 and the remaining counters (e.g., CNT 2 to CNT n) perform their respective counting during the second section R2. And since only the mask counter (e.g., CNT 1) performs the mask counting during the first section R1, and the remaining counters (e.g., CNT 2 to CNT n) perform counting only during the second section R2, the overall number of counting operations performed by the image sensor may be markedly reduced and power consumption reduced accordingly. In this manner, the image sensor 100 of FIG. 1 may provide code values counted by the plurality of counters (CNT 1 to CNT n) as pixel data.

The example specifically illustrated in FIG. 4 shows the first section R1 being of lesser duration than that of the second section R2. However, this need not always be the case, and in other embodiments of the inventive concept the first section R1 may be equal to or greater in duration than that of the second section R2, so long as the second section R2 is not zero. In this regard, the period of time extending between the first time t1 and the second time t2 may be referred to as a "counter enable period" during which at least one of the plurality of counters (CNT 1 to CNT n) is enabled and performing a counting operation. This counter enable period may be variously divided into a first section and a second section. As previously noted, the period of time extending between the first time t1 and the third time t3 may be referred to as a ramp signal enable period.

At this point it should be noted that the pixel signal Vpixel is often unstable and vibrates up and down in response to many factors including noise. The embodiment illustrated in FIG. 4 recognizes the non-ideal nature of the pixel signal Vpixel—see, e.g., Vpixel' and Vpixel" around Vpixel, as well as Vpixel1' and Vpixel1" around Vpixel1. Thus, an ideal second time t2 at which the Vpixel signal and the ramp signal Vramp are equal may move from side to side, like non-ideal second time (t2', t2" and t21', t21"). For example, when the second time t2 moves to another second time (t2' and t21'), the second section R2 decreases to another second section R2' and still another second section R2", and a maximum value of the first section R1 decreases. If the second time t2 moves to another second time (t2" and t21"), the second section R2 increases and the maximum value of the first section R1 increases.

Assuming the same noise width (Vpixel' to Vpixel") of the pixel signal Vpixel, the width at which the second time t2 moves from side to side at a second slope S2 less than the first slope S1 increases. That is, for a ramp signal Vramp having the second slope S2 less than the first slope S1, since the non-ideal second time t2' moves to another non-ideal second time t21' having moved further in the direction of the fourth time t4, the maximum value of the first section R1 should have a smaller value than before.

Figure 5:
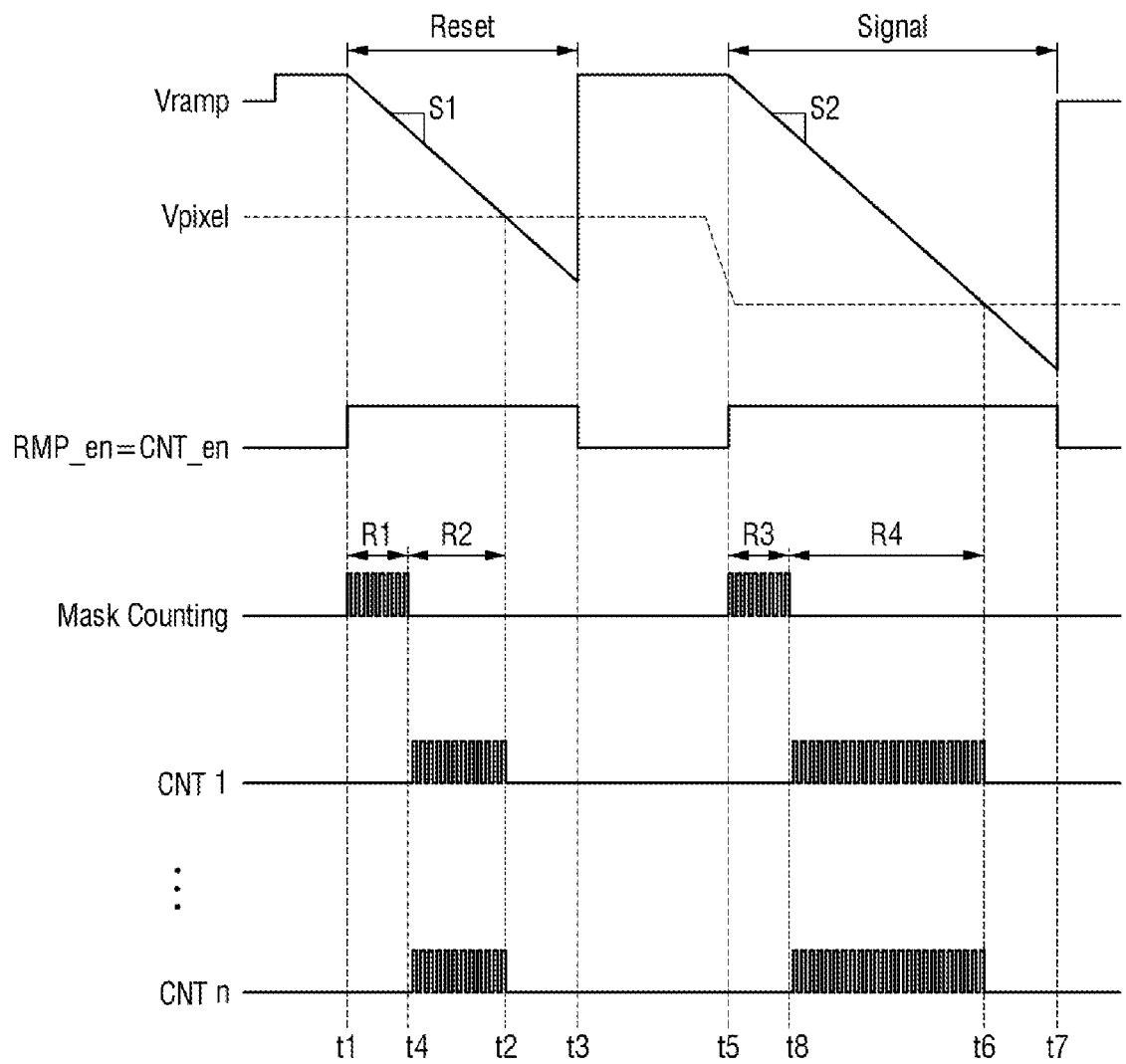

The operation method for the image sensor illustrated in FIG. 5 includes a ramp reset enable period (t1 through t3) followed by a ramp signal enable period (t5 through t7) according to embodiments of the inventive concept.

Referring to FIGS. 2 and 5, the ramp signal Vramp may be used, at least in part, to define the ramp reset enable period (see, the section labeled "Reset" extending from t1 to t3) and the ramp signal enable period (see, the section labeled "Signal" extending from t5 to t7). The timing and nature of the ramp reset enable period (t1 through t3) may be the same as the embodiment described in relation to FIG. 4.

A second (or following) activation (e.g., rise) of the ramp enable signal RMP_en and the counter enable signal CNT_en at a fifth time t5 followed by a second (or following) deactivation (e.g., fall) of the ramp enable signal RMP_en and the counter enable signal CNT_en at a seventh time t7 define a ramp signal enable period. Here, the duration of the ramp reset enable period (t1 through t3) and duration of the ramp signal enable period (t5 through t7) may be different. The slope of the ramp signal Vramp (S1 verse S2) may be the same or different during the ramp reset enable period (t1 through t3) and of the ramp signal enable period (t5 through t7).

Consistent with the foregoing, the comparator 151 may trigger the output signal at the sixth time t6, at which the pixel signal Vpixel and the ramp signal Vramp are equal, and communicate the output signal to the plurality of counters (CNT 1 to CNT n). Hence, the plurality of counters (CNT 1 to CNT n) may start counting (again) at fifth time t5 at which the counter enable signal CNT_en is activated, and finish counting (again) at the sixth time t6 at which the comparator 151 triggers the output signal.

Here analogous to the foregoing, a mask counter (e.g., CNT 1) may perform a mask counting operation during a third section R3 beginning at the fifth time t5 and ending at an eighth time t8, whereas the remaining counters (CNT 2 to CNT n) may perform counting operations during the fourth section R4 beginning at the eighth time t8 and ending at the sixth time t6.

Using the operation method of FIG. 5, the image sensor 100 of FIG. 1 may—using a reset operation performed during the ramp reset enable period—measure a voltage value remaining in a pixel as a reference in order to more accurately acquire pixel data. This "residual voltage value" measured during the reset operation may be different for each pixel. For example, the image sensor 100 may output a code value obtained by subtracting the "reset counting value" counted during the ramp reset enable period from a "signal counting value" counted during the ramp signal enable period as the pixel data.

The embodiments described in relation to FIGS. 3 and 4 assume that the mask counting operation performed by a mask counter is performed before other counting operations performed by the remaining counters. However, this need not always be the case.

Figure 6:
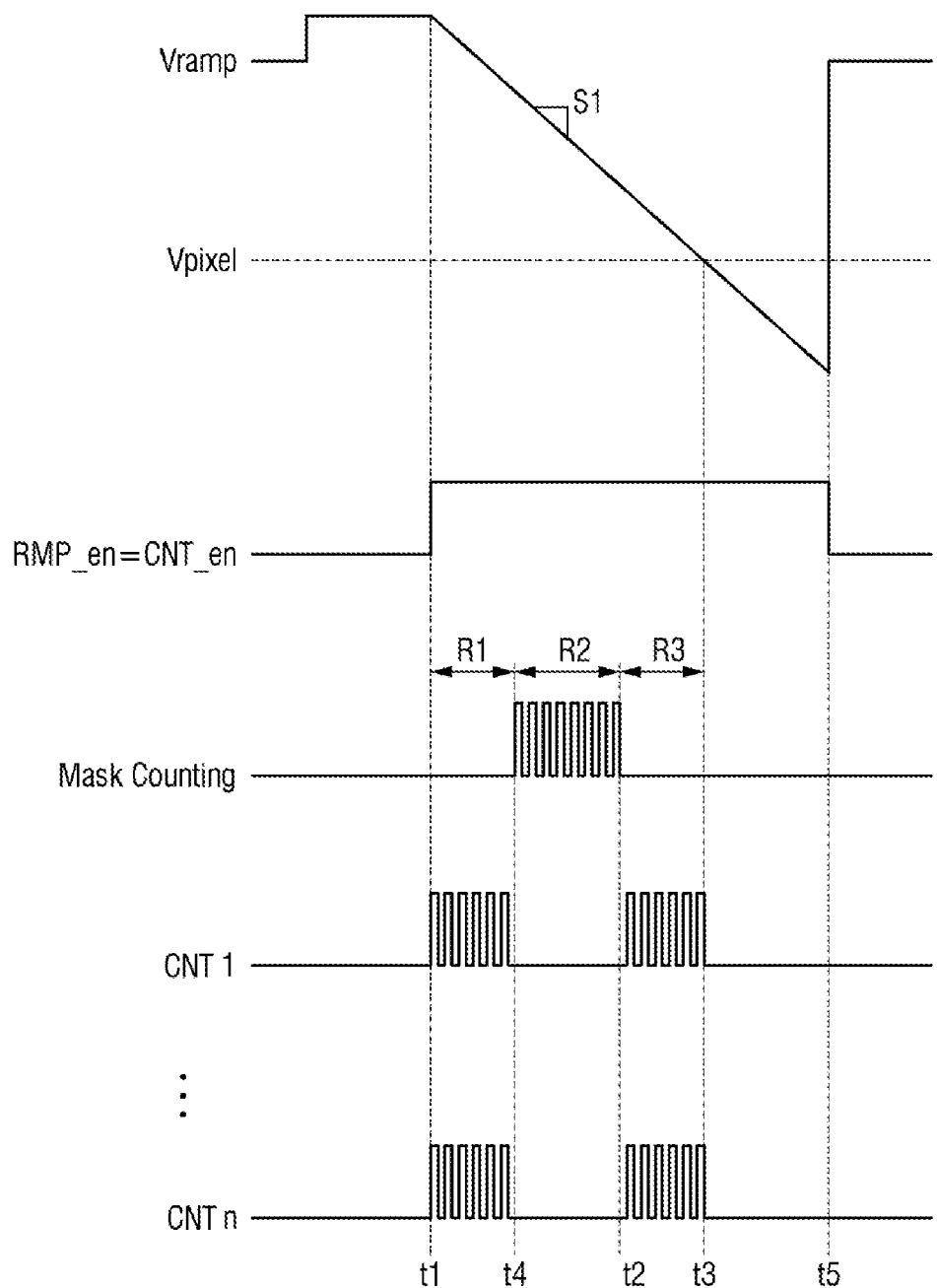

Referring to FIGS. 2 and 6, it is assumed that the ramp activation signal RMP_en and the counter enable signal CNT_en activate (e.g., rise) at a first time t1 and deactivate (e.g., fall) at a fifth time t5, and that a ramp signal Vramp has a constant first slope S1 between the first time t1 and the fifth time t5. Thus, a ramp signal enable period for the embodiment illustrated in FIG. 6 extends from the first time t1 to the fifth time t5.

The comparator 151 may communicate a triggered output signal at the third time t3 at which the pixel signal Vpixel and the ramp signal Vramp are equal to the plurality of counters (CNT 1 to CNT n). Thus, the plurality of counters (CNT 1 to CNT n) starts counting at the first time t1 at which the counter enable signal CNT_en is activated, and ends counting at the third time t3 at which the output signal received from the comparator 151 is triggered. However, consistent with the foregoing embodiments not all counters in the plurality of counters (CNT 1 to CNT n) are actuated during this entire counter enable period between the first time t1 and the third time t3.

For example, the counter enable period for the embodiment illustrated in FIG. 6 may be divided into three sections—a first section R1, a second section R2, and a third section R3, where only the mask counter (e.g., CNT 1) among the plurality of counters (CNT 1 to CNT n) performs the mask counting operation during the second section R2 and the remaining counters among the plurality of counters (CNT 1 to CNT n) perform counting during the first section R1 and the third section R3.

Here, the first section R1, the second section R2, and the third section R3 may vary in duration and relative duration, so long R1, R2 and R3 are respectively non-zero.

Figure 7:
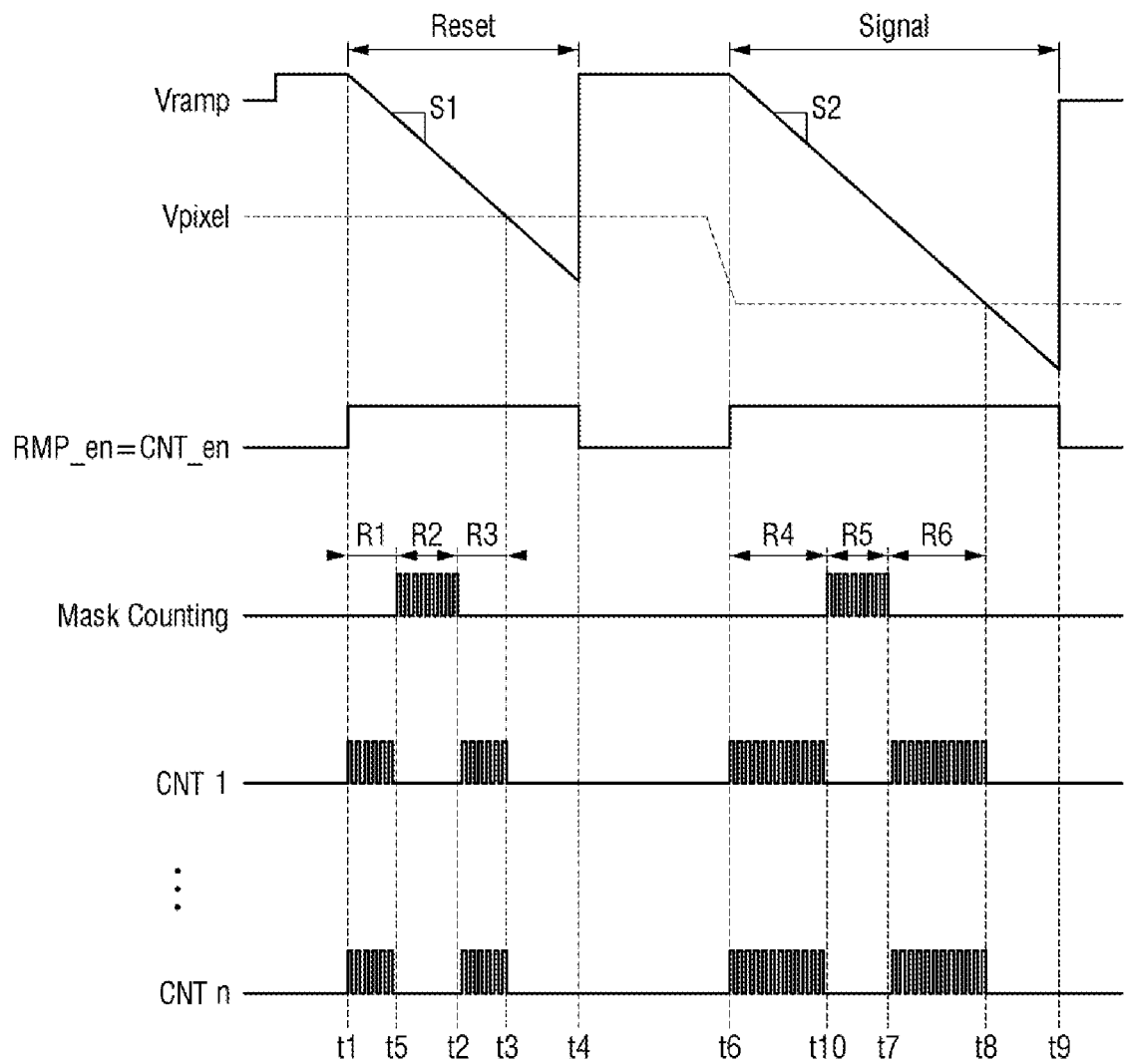

The embodiment illustrated in FIG. 7 combines the features previously described in relation to FIGS. 5 and 6.

Referring to FIGS. 2 and 7, the ramp signal Vramp may include a reset section Reset and a signal section Signal. The ramp enable signal RMP_en and the counter enable signal CNT_en may rise at the sixth time t6 and fall at a ninth time t9. The ramp signal Vramp may start falling at the first slope S1 from the sixth time t6 and may finish falling at the ninth time t9. A waveform of the ramp signal Vramp is not limited thereto. The pixel signal Vpixel is a signal obtained by converting the light into an electric signal in the corresponding pixel of the sensor array 140. A waveform of the pixel signal Vpixel is not limited thereto. The comparator 151 may trigger the output signal at the eighth time t8 at which the pixel signal Vpixel and the ramp signal Vramp meet and transmit the output signal to the plurality of counters (CNT 1 to CNT n). Thus, the plurality of counters (CNT 1 to CNT n) start counting at the sixth time t6 at which the counter enable signal CNT_en is activated, and may finish the counting at the eighth time t8 at which the output signal received from the comparator 151 is triggered.

According to some embodiments, only a portion (e.g., the first counter CNT 1) of the plurality of counters (CNT 1 to CNT n) may perform the counting operation from the sixth time t6 to the eighth time t8. The number of a part of the plurality of counters (CNT 1 to CNT n) is not limited to one. In addition, the type of a part of the plurality of counters (CNT 1 to CNT n) is not limited to the first counter CNT 1. The counting operation during the fifth section R5 from the tenth time t10 to the seventh time t7 among the counting operations of the first counter CNT 1 may be defined by the mask counting. That is, the mask counting operation may be performed only on the first counter CNT 1. The second to n-th counters (CNT 2 to CNT n) may perform the counting operation during the fourth and sixth sections R4 and R6 except the mask counting. Since only one counter (the first counter CNT 1) performs the counting during the first to third sections R1 to R3, and the remaining counters (the second counter CNT 2 to the n-th counters CNT n) perform the counting operation only during the fourth and sixth sections R4 and R6, the counting operation performed by the image sensor may be reduced. Thus, the power consumed by the image sensor may be reduced.

Unlike the case illustrated in FIG. 7, the fifth section R5 may be longer in duration than the combined duration of the fourth and sixth sections R4 and R6. However, the duration of the fourth and sixth sections R6 may not be zero. As described with respect to FIG. 4, the pixel signal Vpixel may vibrate up and down including noise. Thus, the eighth time t8 at which the pixel signal Vpixel and the ramp signal Vramp meet may move from side to side. Therefore, the maximum value of the fifth section R5 in which the lengths of the fourth and sixth sections R6 do not become 0 may also change. With noise of the same pixel signal Vpixel, as the first slope S1 becomes gentler, the width at which the eighth time t8 moves from side to side further increases. That is, in the ramp signal Vramp having a slope gentler than the first slope S1, the maximum value of the fifth section R5 should have a smaller value than before.

The image sensor 100 of FIG. 1 may measure the voltage value remaining in the pixel as a reference for acquiring accurate pixel data in the reset section Reset. The residual voltage values measured in the reset section may be different for each pixel. The image sensor may output a code value obtained by subtracting the reset counting value counted in the reset section Reset from the signal counting value counted in the signal section Signal, as the pixel data.

Figure 8:
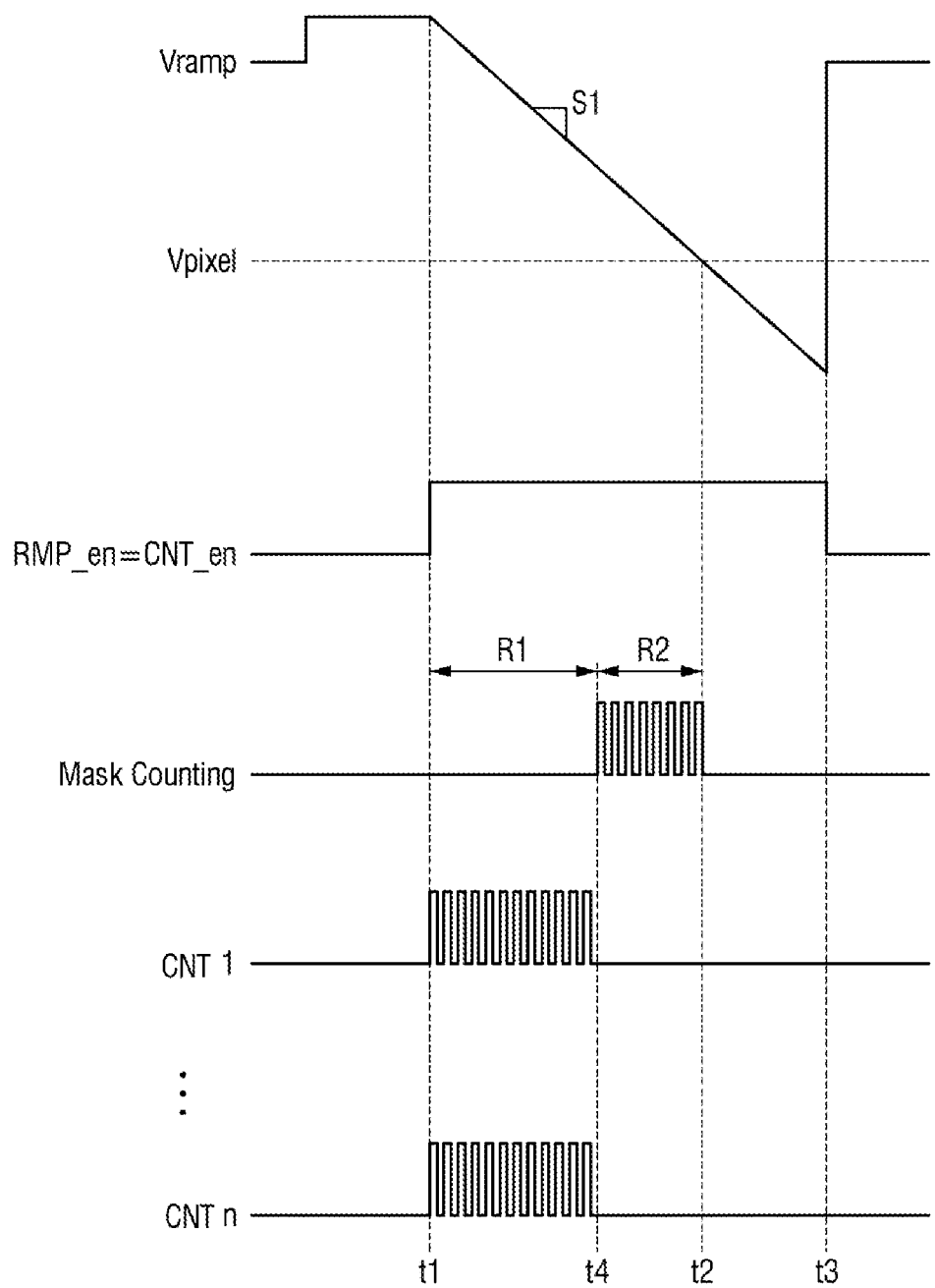

Other method embodiments of the inventive concept like the one shown in FIG. 8 perform a mask counting operation after performing other counting operations Referring to FIGS. 2 and 8, the ramp activation signal RMP_en and the counter enable signal CNT_en activate (e.g., rise) at a first time t1 and deactivate (e.g., fall) at a third time t3. The ramp signal Vramp may start falling at the first slope S1 from the first time t1 and may finish falling at the third time t3. The comparator 151 may transmit an output signal triggered at the second time t2, at which the pixel signal Vpixel and the ramp signal Vramp meet, to the plurality of counters (CNT 1 to CNT n). That is, the plurality of counters (CNT 1 to CNT n) start counting at the first time t1 at which the counter enable signal CNT_en is activated, and may finish the counting at the second time t2 at which at the output signal received from the comparator 151 is triggered.

Consistent with the foregoing, not all of the plurality of counters (CNT 1 to CNT n) perform a counting operation during a first section R1 of the counter enable period extending from the first time t1 to the second time t2. At least one counter (e.g., the mask counter) performs a counting operation during the second section R2 of the counter enable period extending from the fourth time t4 to the second time t2. That is, the mask counting operation may be performed only on the first counter CNT 1. The second to n-th counters (CNT 2 to CNT n) may perform the counting operation during the first section R1 except the mask counting. Since only one counter (the first counter CNT 1) performs counting during the first and second section R2, and the remaining counters (the second counter CNT 2 to the n-th counter CNT n) perform the counting operation only during the first section R1, the counting operation performed by the image sensor may be reduced. Thus, the power consumed by the image sensor may be reduced. The image sensor may output code values counted by the plurality of counters (CNT 1 to CNT n) as pixel data.

Figure 9:
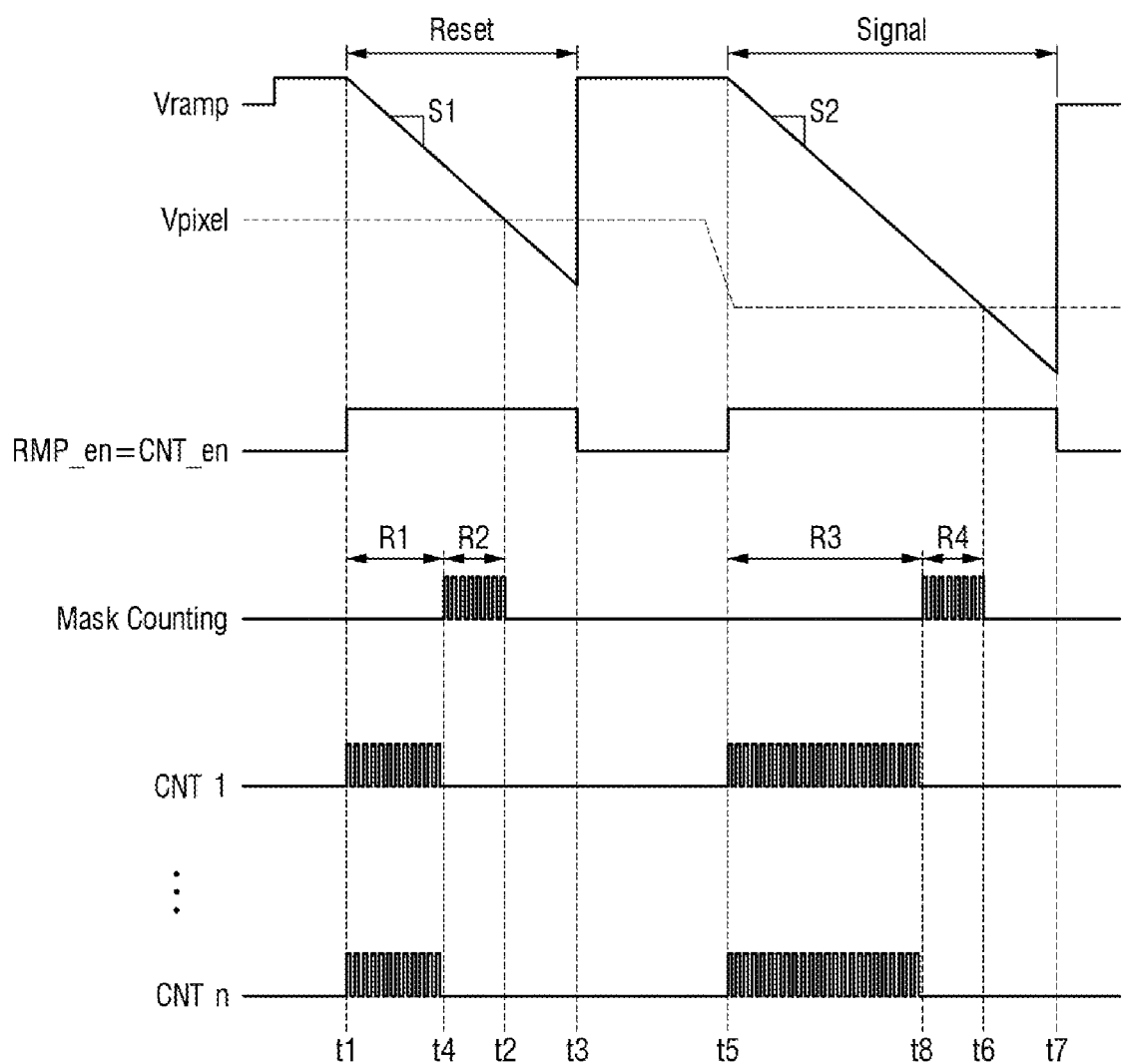

The embodiment illustrated in FIG. 9 combines the features previously described in relation to FIGS. 5 and 8.

Referring to FIGS. 2 and 9, the ramp signal Vramp may include a reset section Reset and a signal section Signal. Since the operation of the image sensor in the reset section Reset is the same as the description of FIG. 8, the description thereof will not be provided. The ramp enable signal RMP_en and the counter enable signal CNT_en may rise at the fifth time t5 and fall at the seventh time t7. The ramp signal Vramp may start falling at the first slope S1 from the fifth time t5 and finish falling at the seventh time t7. The pixel signal Vpixel is a signal obtained by converting the light into an electric signal in the corresponding pixel of the sensor array 140. The comparator 151 may transmit the output signal triggered at the sixth time t6 at which the pixel signal Vpixel and the ramp signal Vramp meet to a plurality of counters (CNT 1 to CNT n). The plurality of counters (CNT 1 to CNT n) start counting at the fifth time t5 at which the counter enable signal CNT_en is activated, and may finish counting at the sixth time t6 at which the output signal received from the comparator 151 is triggered.

Consistent with the foregoing only a portion of the plurality of counters (CNT 1 to CNT n) perform counting operations from the fifth time t5 to the sixth time t6. The counting operation during the fourth section R4 from the eighth time t8 to the sixth time t6 among the counting operations of the first counter CNT 1 may be defined by mask counting. That is, the mask counting operation may be performed only on the first counter CNT 1. The second to n-th counters (CNT 2 to CNT n) may perform the counting operation during the third section R3 except the mask counting. Since only one counter (the first counter CNT 1) performs the counting operation during the first and fourth sections R4, and the remaining counters (the second counter CNT 2 to the n-th counter CNT n) perform the counting operation only during the third section R3, the counting operation performed by the image sensor may be reduced. Thus, the power consumed by the image sensor may be reduced.

The image sensor 100 of FIG. 100 may measure a voltage value remaining in the pixel as a reference for acquiring accurate pixel data in the reset section Reset. The residual voltage value measured in the reset section may be different for each pixel. The image sensor may output a code value obtained by subtracting the reset counting value counted in the reset section Reset from the signal counting value counted in the signal section Signal, as the pixel data.

Figure 10:
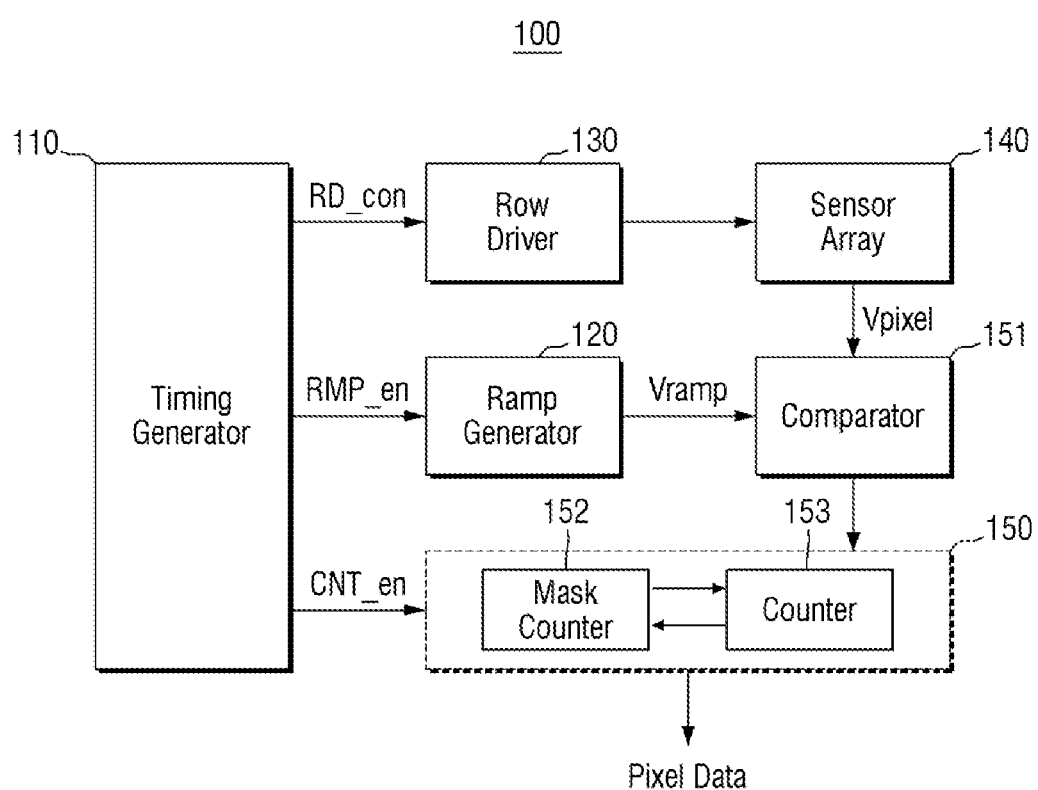
FIGS. 10, 11, 12 and 13 are respective block diagrams illustrating image sensors according to other embodiments of the inventive concept.
Figure 11:
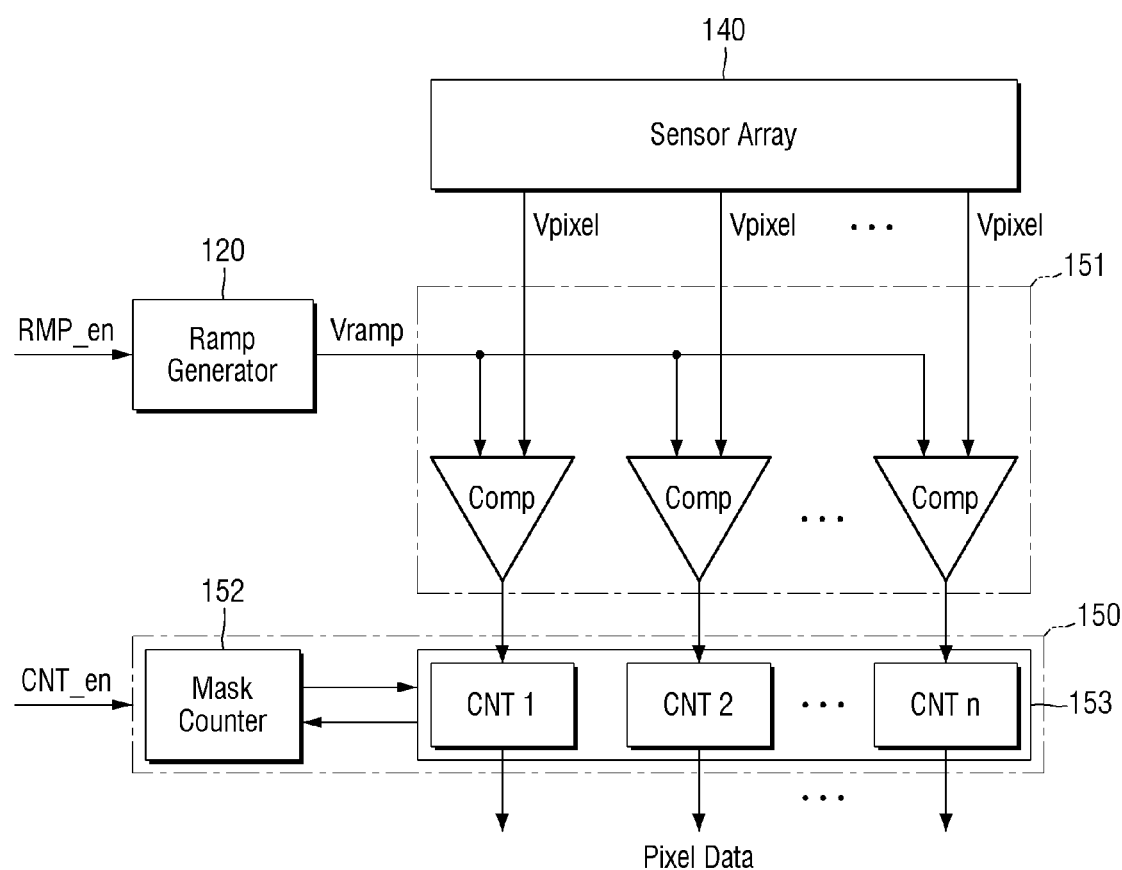

FIGS. 10 and 11 are block diagrams illustrating the image sensor 100 of FIG. 1 according to embodiments of the inventive concept. Referring to FIGS. 1 through 11, the counter unit 150 further includes a mask counter 152, wherein the mask counter 152 may be used to perform mask counting operations. That is, the mask counter 152 independently performs the mask counting operation, and the plurality of counters (CNT 1 to CNT n) may perform remaining counting operations. Thus, the counting operation performed by the image sensor may be reduced. Thus, the power consumed by the image sensor may be reduced. The mask counter 152 may be used to perform the mask counting in response to the counter enable signal CNT_en. Further, the mask counter 152 may communicate (e.g., transmit and/or receive) the executed mask counting information to and from the counter 153 including the plurality of counters (CNT 1 to CNT n).

Figure 12:
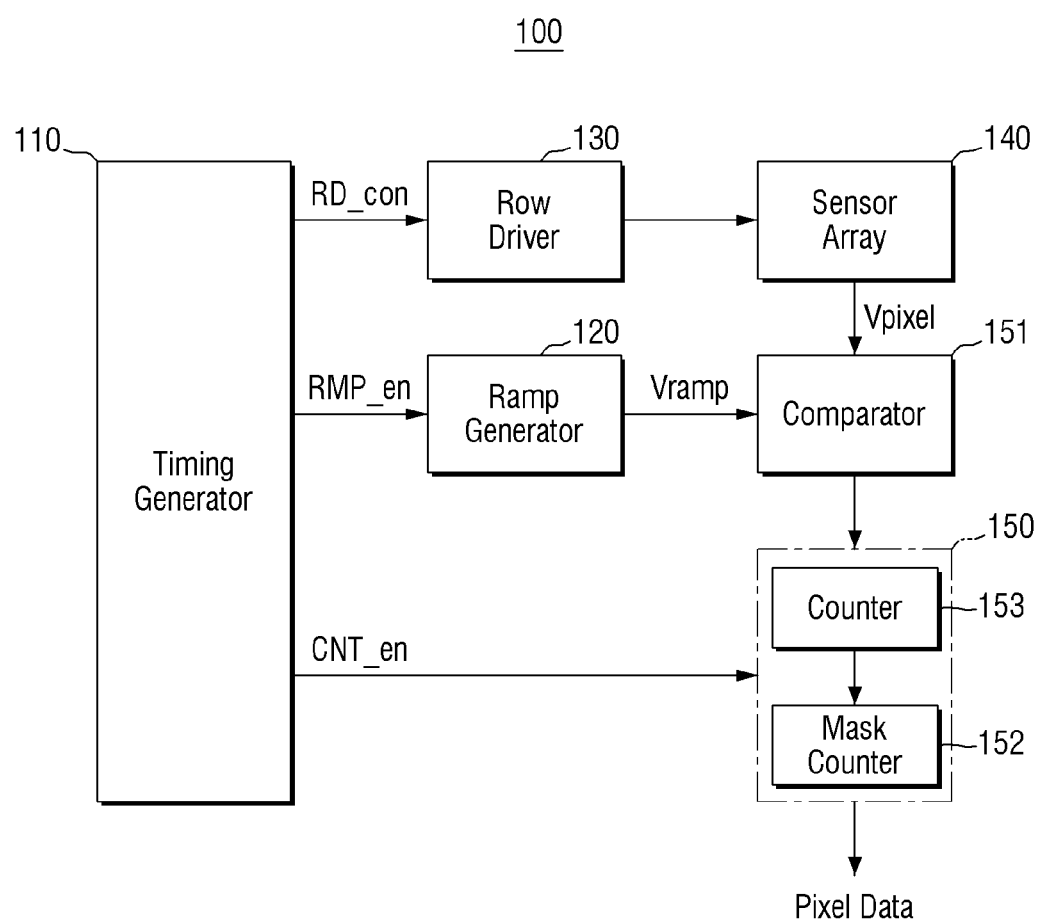
Figure 13:
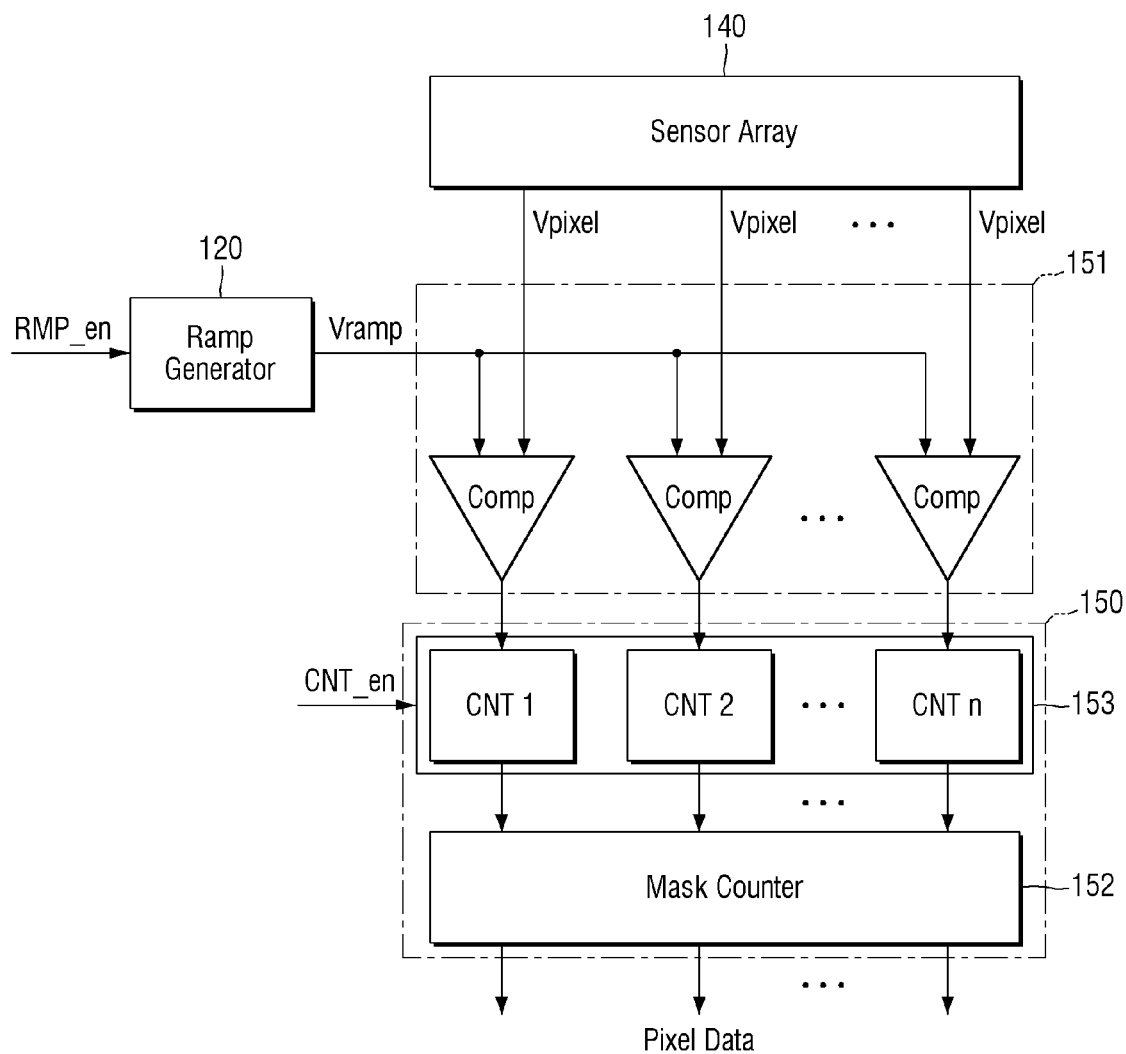

FIGS. 12 and 13 are block diagram further illustrating in other examples the image sensor 100 of FIG. 10 according to embodiments of the inventive concept.

Referring to FIGS. 1 through 13, the counter unit 150 further includes a mask counter 152, where the mask counter 152 may be used to perform mask counting operations. Hence, the plurality of counters (CNT 1 to CNT n) performs the counting operation, and the mask counter 152 may independently perform the mask counting operation. Thus, the counting operation performed by the image sensor may be reduced. Thus, the power consumed by the image sensor may be reduced. The counter 153 may perform counting in response to the counter enable signal CNT_en. The mask counter 152 may receive the information counted by the counter 153 including the plurality of counters (CNT 1 to CNT n) to perform the mask counting. The mask counter 152 may output pixel data Pixel Data, on the basis of the information counted by the counter 153 and the information counted by the mask counter 152.

Figure 14:
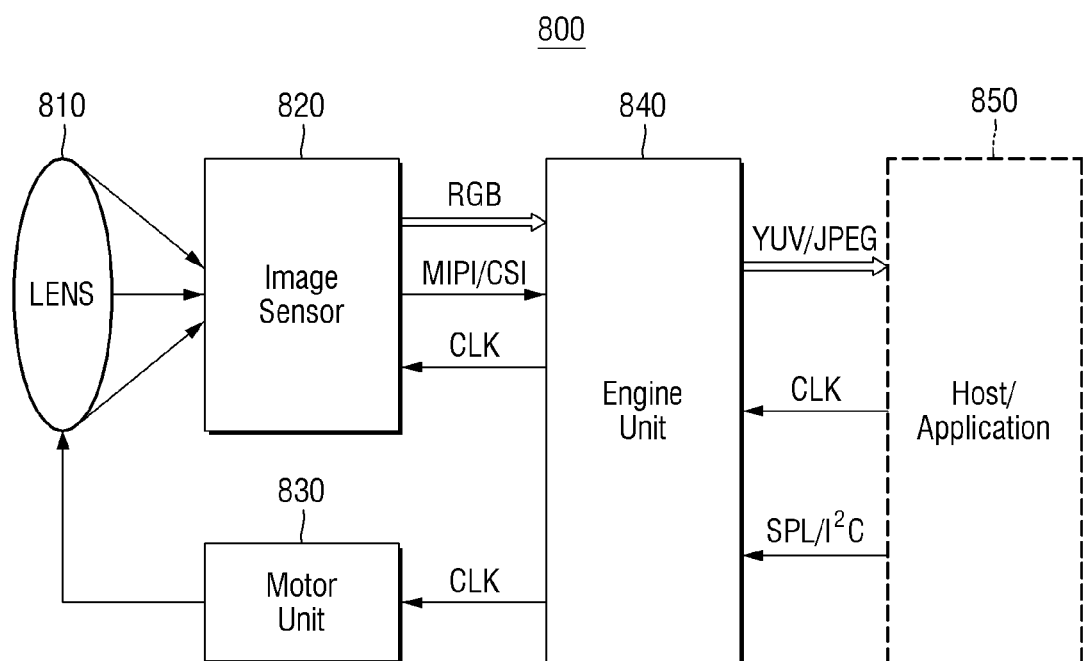
FIG. 14 is a block diagram illustrating a digital camera that may incorporate an image sensor according to embodiments of the inventive concept.

FIG. 14 is a block diagram illustrating in one example a digital camera 800 that may incorporate an image sensor according to embodiments of the inventive concept.

Referring to FIG. 14, the digital camera 800 comprises a lens 810, an image sensor 820, a motor unit 830, and an engine unit 840. Here, the image sensor 820 may include the image sensor according to the embodiment of the present invention described above.

The lens 810 focuses incident light on a light-receiving region of the image sensor 820. The image sensor 820 may generate RGB data RGB of a Bayer pattern, on the basis of light incident through the lens 810. The image sensor 820 may provide RGB data RGB on the basis of the clock signal CLK.

In some embodiments of the present invention, the image sensor 820 may interface with the engine unit 840 via a mobile industry processor interface (MIPI) and/or a camera serial interface (CSI).

The motor unit 830 may adjust the focus of the lens 810 or perform shuttering in response to a control signal CTRL received from the engine unit 840. The engine unit 840 may control the image sensor 820 and the motor unit 830. In addition, the engine unit 840 may generate YUV data YUV including a luminance component, a difference between the luminance component and the blue component, and a difference between the luminance component and the red component on the basis of RGB data RGB received from the image sensor 820 or may generate the compressed data, for example, JPEG (Joint Photography Experts Group) data.

The engine unit 840 may be connected to a host/application 850, and the engine unit 840 may provide the YUV data YUV or JPEG data to the host/application 850 on the basis of the master clock MCLK. Also, the engine unit 840 may interface with the host/application 850 via a serial peripheral interface (SPI) and/or an inter integrated circuit (I2C).

Figure 15:
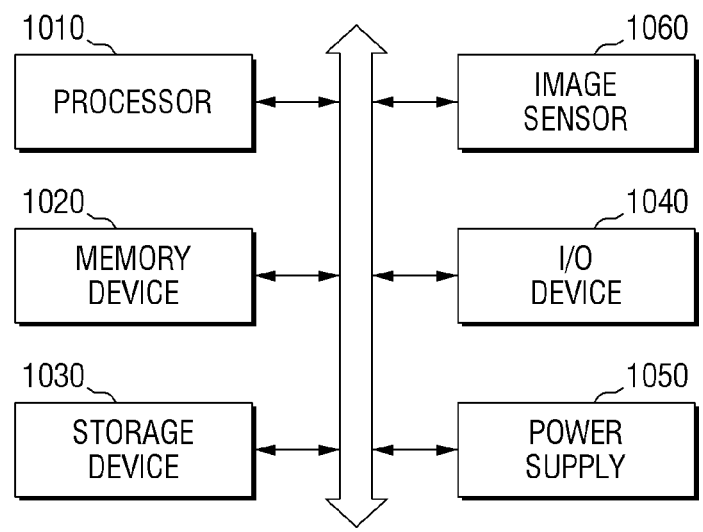
FIG. 15 is a block diagram illustrating an image system that may incorporate an image sensor according to embodiments of the inventive concept.

FIG. 15 is a block diagram illustrating an image system 1000 that may incorporate an image sensor according to embodiments of the inventive concept.

Referring to FIG. 15, the image system 1000 comprises; a processor 1010, a memory device 1020, a storage device 1030, an I/O device 1040, a power supply 1050, and an image sensor 1060.

Here, the image sensor according to the above-described embodiments of the present invention may be used as the image sensor 1060. On the other hand, although not illustrated in FIG. 15, the image system 1000 may include ports capable of communicating with a video card, a sound card, a memory card, a USB device, etc., or capable of communicating with other electronic devices.

The processor 1010 may perform particular calculations or tasks. According to an embodiment, the processor 1010 may be a micro-processor, and a central processing unit (CPU).

The processor 1010 may communicate with the memory device 1020, the storage device 1030 and the I/O device 1040 via an address bus, a control bus and a data bus.

According to the embodiment, the processor 1010 may also be connected to an expansion bus, such as a peripheral component interconnect (PCI) bus.

The memory device 1020 may store data necessary for operation of the image system 1000.

For example, the memory device 1020 may be implemented as a DRAM, a mobile DRAM, an SRAM, a PRAM, a FRAM, an RRAM and/or a MRAM. The storage device 1030 may include a solid state drive (SSD), a hard disk drive (HDD), a CD-ROM, and the like.

The I/O device 1040 may include input means such as a keyboard, a keypad, a mouse, and output means such as a printer and a display. The power supply 1050 may supply the operating voltage necessary for the operation of the electronic device 1000.

The image sensor 1060 may be connected to the processor 1010 via buses or other communication link to perform communication. The image sensor 1060 may be integrated on one chip together with the processor 1010, or may be integrated on each of the different chips.

Here, the image system 1000 should be interpreted as all computing systems that use the image sensor. For example, the image system 1000 may include a digital camera, a mobile phone, a PDA (Personal Digital Assistants), a PMP (Portable Multimedia Player), a smart phone, a tablet PC, and the like.

Also, in some embodiments of the present invention, the image system 1000 may include a UMPC (Ultra Mobile PC), a workstation, a net-book, a portable computer, a wireless phone, a mobile phone, an e-book, a portable game console, a navigation device, a black box, a 3-dimensional television, a digital audio recorder, a digital audio player, a digital picture recorder, a digital picture player, a digital video recorder, a digital video player, and the like.

Figure 16:
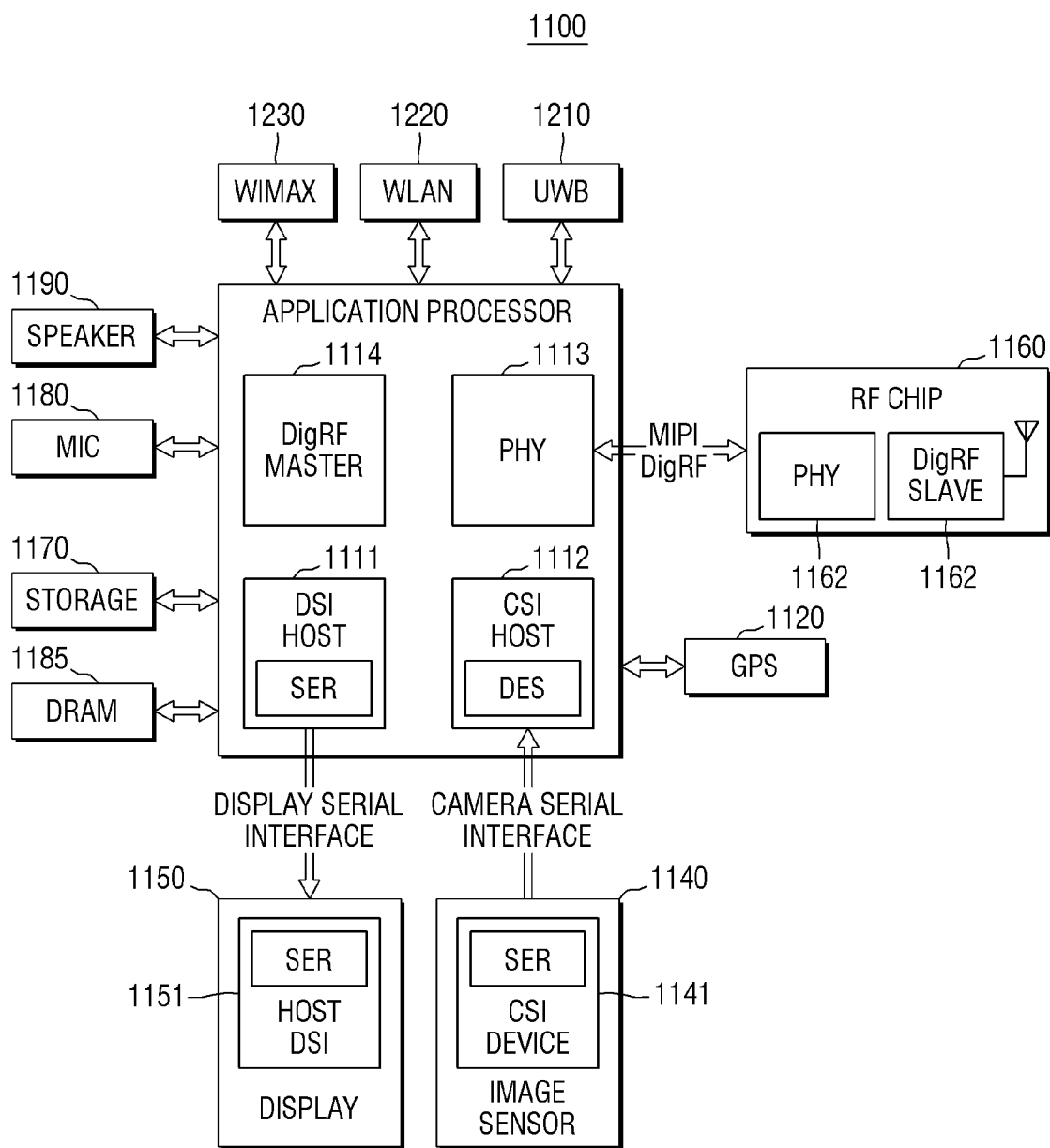
FIG. 16 is a block diagram further illustrating an interface that may be used in the image system of FIG. 15.

FIG. 16 is a block diagram illustrating a computing system 1100 that may incorporate an image system according to embodiments of the inventive concept.

Referring to FIG. 16, the computing system 1100 may be implemented as a data processing device capable of using or supporting the MIPI interface, and may include an application processor 1110, an image sensor 1140, a display 1150, and the like.

A CSI host 1112 of the application processor 1110 may perform serial communication with the CSI device 1141 of the image sensor 1140 via a camera serial interface (CSI).

In some embodiments of the present invention, the CSI host 1112 may include a deserializer (DES), and the CSI device 1141 may include a serializer (SER). The DSI host 1111 of the application processor 1110 may perform serial communication with the DSI device 1151 of the display 1150 via a display serial interface (DSI).

In some embodiments of the present invention, the DSI host 1111 may include a serializer (SER), and the DSI device 1151 may include a deserializer (DES). Additionally, the computing system 1100 may further include a radio frequency (RF) chip 1160 that may perform communication with the application processor 1110. A PHY 1113 of the computing system 1100 and a PHY 1161 of the RF chip 1160 may transmit and receive data in accordance with a mobile industry processor interface (MIPI) DigRF.

Also, the application processor 1110 may further include a DigRF MASTER 1114 that controls the data transmission and reception according to the MIPI DigRF of the PHY 1161. On the other hand, the computing system 1100 may include a global positioning system (GPS) 1120, a storage 1170, a microphone 1180, a dynamic random access memory (DRAM) 1185 and a speaker 1190. In addition, the computing system 1100 may perform communication, using an ultra wide band (UWB) 1210, a wireless local area network (WLAN) 1220, a worldwide interoperability for microwave access (WIMAX) 1230 and the like. However, the structure and interface of the computing system 1100 are an example, and the present invention is not limited thereto.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. An image sensor comprising:
a sensor array which generates a pixel signal;
a ramp signal generator which generates a ramp signal in response to a ramp enable signal, wherein the ramp signal has a decreasing slope during a ramp signal enable period extending between a first time at which a counter enable signal is activated and a third time at which the ramp signal ends falling;
a comparator which compares the pixel signal with the ramp signal to trigger an output signal; and
a counter unit including a plurality of counters, wherein at least one of the plurality of counters performs counting during a counter enable period extending between the first time and a second time at which the comparator triggers the output signal,
wherein the counter enable period is divided into a first section and a second section,
the plurality of counters includes a mask counter and remaining counters among the plurality of counters except the mask counter, and
not all of the plurality of counters perform the counting during at least one of the first section and the second section.

2. The image sensor of claim 1, wherein the comparator triggers the output signal when the ramp signal equals the pixel signal.

3. The image sensor of claim 1, wherein the second section follows the first section, and
the mask counter performs a mask counting only during the first section, and the remaining counters perform counting during the second section.

4. The image sensor of claim 1, wherein the second section follows the first section, and
the mask counter performs a mask counting only during the second section, and the remaining counters perform counting during the first section.

5. The image sensor of claim 1, wherein a duration of the first section is not equal to a duration of the second section.

6. The image sensor of claim 1, wherein the duration of the first section is less than the duration of the second section.

7. The image sensor of claim 1, further comprising:
a signal timing generator configured to generate the ramp enable signal and the counter enable signal.

8. The image sensor of claim 7, wherein the ramp enable signal and the counter enable signal are synchronously activated by the signal timing generator.

9. The image sensor of claim 7, further comprising:
a row driver electrically connected to pixels of the sensor array in a row unit and configured to sequentially drive the pixels in the row unit in response to a row driver control signal generated by the signal timing generator.

10. The image sensor of claim 1, wherein the mask counter is configured to communicate executed mask counting information with the plurality of counters.

11. A method for operating an image sensor, the method comprising:
generating a pixel signal in a sensor array;
generating a ramp signal in response to a ramp enable signal, wherein the ramp signal has a decreasing slope during a ramp signal enable period extending between a first time at which a counter enable signal is activated and a third time at which the ramp signal ends falling;
comparing the pixel signal with the ramp signal to trigger an output signal; and
using at least one of a plurality of counters to perform counting during a counter enable period extending between the first time and a second time at which the comparator triggers the output signal,
wherein the counter enable period is divided into a first section and a second section following the first section,
the plurality of counters includes a mask counter and remaining counters among the plurality of counters except the mask counter, and not all of the plurality of counters perform the counting during at least one of the first section and the second section.

12. The method of claim 11, wherein the output signal is triggered when the ramp signal and the pixel signal are equal.

13. The method of claim 11, wherein the mask counter performs a mask counting during only the first section, and the remaining counters perform counting during the second section.

14. The method of claim 11, wherein the mask counter performs a mask counting during only the second section, and the remaining counters perform counting during the first section.

15. The method of claim 11, wherein a duration of the first section is not equal to a duration of the second section.

16. The method of claim 11, wherein the duration of the first section is less than a duration of the second section.

17. The method of claim 11, wherein the ramp enable signal and the counter enable signal are synchronously activated.

18. An image system comprising:
- an image sensor which converts incident light into a corresponding digital signal, and a memory device which stores the digital signal,
- wherein the image sensor comprises:
  - a sensor array which generates a pixel signal;
  - a ramp signal generator which generates a ramp signal in response to a ramp enable signal, wherein the ramp signal has a decreasing slope during a ramp signal enable period extending between a first time at which a counter enable signal is activated and a third time at which the ramp signal ends falling;
  - a comparator which compares the pixel signal with the ramp signal to trigger an output signal when the ramp signal equals the pixel signal; and
  - a counter unit including a plurality of counters, wherein at least one of the plurality of counters performs counting during a counter enable period extending between the first time and a second time at which the comparator triggers the output signal,
- wherein the counter enable period is divided into a plurality of sections,
- the plurality of counters includes a mask counter and remaining counters among the plurality of counters except the mask counter, and
- the mask counter performs a mask counting only during one of the plurality of first sections, and the remaining counters perform counting during other ones of the plurality of sections.

19. The image system of claim 18, wherein the plurality of sections includes a first section, a second section and a third section, and
the mask counter performs the mask counting only during the second section, and the remaining counters perform the counting during the first section and the third section.

20. The image system of claim 18, wherein the mask counter is configured to communicate executed mask counting information with the plurality of counters.

* * * * *